(12) United States Patent
Wei et al.

(10) Patent No.: US 9,588,138 B2
(45) Date of Patent: Mar. 7, 2017

(54) ELECTRIC BASE, ELECTRIC GATEWAY, AND ELECTRIC GATEWAY BODY

(71) Applicant: Huawei Device Co., Ltd., Shenzhen (CN)

(72) Inventors: Yezong Wei, Shenzhen (CN); Jianguang Wu, Shenzhen (CN); Jun Yang, Shenzhen (CN); Fenghua Jing, Shenzhen (CN); Wen Song, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 207 days.

(21) Appl. No.: 14/313,066

(22) Filed: Jun. 24, 2014

(65) Prior Publication Data

US 2014/0301024 A1    Oct. 9, 2014

Related U.S. Application Data

(63) Continuation of application No. PCT/CN2013/072834, filed on Mar. 19, 2013.

(30) Foreign Application Priority Data

Mar. 31, 2012 (CN) .................... 2012 2 0146182 U

(51) Int. Cl.
*G01R 1/04* (2006.01)
*H01R 9/24* (2006.01)
*H01R 4/36* (2006.01)

(52) U.S. Cl.
CPC ................. *G01R 1/04* (2013.01); *H01R 4/36* (2013.01); *H01R 9/2491* (2013.01);
(Continued)

(58) Field of Classification Search
CPC ........................................................ H01R 9/22
(Continued)

(56) References Cited

U.S. PATENT DOCUMENTS

| | | | |
|---|---|---|---|
| 7,025,634 B1 | 4/2006 | Swantner et al. | |
| 2002/0076991 A1* | 6/2002 | Conde | H01R 12/515 439/709 |

(Continued)

FOREIGN PATENT DOCUMENTS

| | | |
|---|---|---|
| CN | 2143004 Y | 9/1993 |
| CN | 2338884 Y | 9/1999 |

(Continued)

OTHER PUBLICATIONS

Partial English Translation and Abstract of Chinese Patent Application No. CN2143004Y, May 6, 2014, 11 pages.

(Continued)

*Primary Examiner* — William H Mayo, III
*Assistant Examiner* — Krystal Robinson
(74) *Attorney, Agent, or Firm* — Conley Rose, P.C.

(57) ABSTRACT

An electric base, an electric gateway, and an electric gateway body are presented. The electric base includes: an electric base body, where two guide holes for passing cables in an electric grid are arranged in the electric base body, an output end for outputting a voltage of the cables is arranged on the electric base body and protrudes from the electric base body, and a conductor structure is nested in the electric base body to connect the cables and the output end. The foregoing electric base can be electrically connected to an input end of the electric gateway body and output power to enable the electric gateway body to operate.

18 Claims, 15 Drawing Sheets

(52) U.S. Cl.
CPC ...... *H01R 2201/04* (2013.01); *H01R 2201/06* (2013.01); *H01R 2201/20* (2013.01)

(58) Field of Classification Search
USPC ............................................ 439/22; 385/100
See application file for complete search history.

(56) References Cited

U.S. PATENT DOCUMENTS

| | | |
|---|---|---|
| 2005/0202715 A1 | 9/2005 | Kellerman |
| 2006/0110986 A1* | 5/2006 | King, Jr. .................. H01R 4/36 439/709 |
| 2011/0120841 A1* | 5/2011 | Sandano ................ G01R 11/04 200/43.11 |

FOREIGN PATENT DOCUMENTS

| | | | |
|---|---|---|---|
| CN | 2775949 Y | | 4/2006 |
| CN | 200997452 Y | * | 12/2007 |
| CN | 202523950 U | | 11/2012 |
| DE | 10216913 A1 | * | 5/2003 ........... H01R 9/2491 |
| EP | 1340986 A2 | | 9/2003 |
| EP | 2693576 A1 | | 2/2014 |
| WO | 2008123875 A2 | | 10/2008 |

OTHER PUBLICATIONS

Partial English Translation and Abstract of Chinese Patent Application No. CN2775949, May 6, 2014, 17 pages.
Partial English Translation and Abstract of Chinese Patent Application No. CN200997452, May 6, 2014, 11 pages.
Foreign Communication From A Counterpart Application, PCT Application No. PCT/CN2013/072834, English Translation of International Search Report dated Jun. 27, 2013, 4 pages.
Foreign Communication From A Counterpart Application, PCT Application No. PCT/CN2013/072834, Written Opinion dated Jun. 27, 2013, 6 pages.
Partial English Translation and Abstract of German Patent Application No. DE10216913A1, Part 1, Oct. 22, 2014, 19 pages.
Partial English Translation and Abstract of German Patent Application No. DE10216913A1, Part 2, Oct. 22, 2014, 6 pages.
Foreign Communication From a Counterpart Application, European Application No. 13768991.5, Extended European Search Report dated Sep. 24, 2014, 7 pages.

* cited by examiner

ELECTRIC BASE, ELECTRIC GATEWAY, AND ELECTRIC GATEWAY BODY

CROSS-REFERENCE TO RELATED APPLICATIONS

This application is a continuation of International Application No. PCT/CN2013/072834, filed on Mar. 19, 2013, which claims priority to Chinese Patent Application No. 201220146182.X, filed on Mar. 31, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to electric technologies, and in particular, to an electric base, an electric gateway, and an electric gateway body.

BACKGROUND

Currently an electric gateway (e.g., a HUB) is a shared device for centrally managing a network; for example, it regenerates and amplifies received signals to extend transmission distance of the network. In the prior art, a network can be flexibly deployed by using a HUB. For example, a HUB located at a star node of the network can centrally manage work stations connected to the star node so as to prevent a faulty work station affecting normal operation of an entire network.

However, a HUB in the prior art needs to be connected to various alternating current power supplies by using a universal connection device (such as a socket, a connector, or the like), so as to power the HUB. As a result, the HUB cannot be used in areas where no universal connection device is arranged, the use of the HUB is limited, thereby affecting the deployment of the entire network.

SUMMARY

In view of the above defect in the prior art, the present invention provides an electric base, an electric gateway, and an electric gateway body.

An electric base includes: an electric base body, where two guide holes for passing cables in an electric grid are arranged in the electric base body; an output end for outputting a voltage of the cable is arranged on the electric base body and protrudes from the electric base body; and a conductor structure is nested in the electric base body to electrically connect the cable and the output end.

The conductor structure in the electric base body is a conductive copper block; a through hole for passing the cable is arranged on one end of the conductive copper block; the through hole is disposed in the guide hole; when the cable passes through the through hole, the conductive copper block is electrically connected to the cable located in the through hole; and the other end of the conductive copper block is electrically connected to the output end, or the other end of the conductive copper block is electrically connected to the output end through a wire.

The foregoing electric base further includes a fastener for fastening the conductive copper block and the cable. Preferably, the fastener is a screw; correspondingly the conductive copper block is arranged with a screw hole communicated with the through hole, and the screw passes through the screw hole to fasten the cable and the conductive copper block.

The foregoing electric base further includes a spacer for separating the cable passing through the electric base body from a neighboring device that shares the cable. In particular, the spacer for passing the cable is communicated with the guide hole.

The foregoing electric base body includes a bottom shell arranged with the guide holes and the conductor structure, and a cover matching the bottom shell; and the output end is arranged on the bottom shell and protrudes from the cover.

The foregoing electric base further includes an electric meter, where correspondingly, the cable passing through the electric base body is a cable connected to an input end of the electric meter, or the cable passing through the electric base body is a cable connected to an output end of the electric meter.

The output end of the foregoing electric base is a socket structure with two contact holes.

An electric gateway according to the present invention includes an electric gateway body and any one of the electric bases according to the present invention; and an output end of the electric base is electrically connected to an input end of the electric gateway body.

An electric gateway body according to the present invention includes a concentrator box and an input end for supplying a power voltage to the concentrator box, where the input end is a plug structure for matching an output end of an electric base.

As can be seen from the forgoing technical solutions, in the electric base, electric gateway, and electric gateway body according to the present invention, a conductor structure is adopted to directly conduct the voltage of a cable that passes through a guide hole in the electric gateway body, and then the voltage that is the same as the voltage of the cable and enables the electric gateway body to operate is output through the output end of the electric base, thereby effectively saving the cost of the universal connection device required to be arranged in an electric gateway in the prior art and meanwhile expanding the application scope of the electric gateway.

Figure 1:
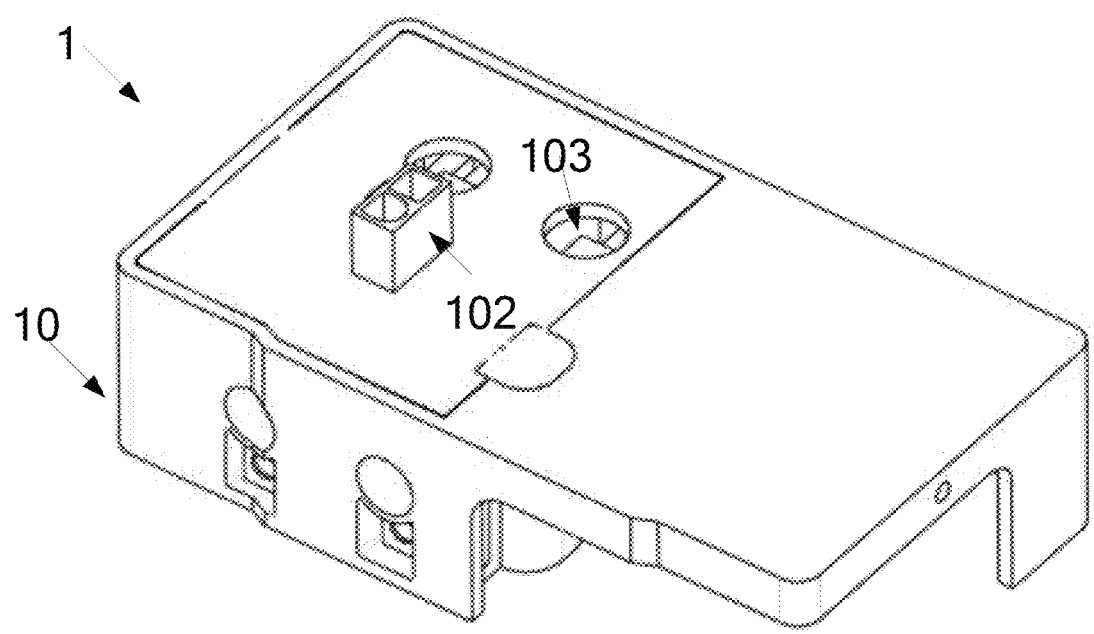
FIG. 1 is a schematic structural diagram of an electric base according to an embodiment of the present invention.

Reference signs in the accompanying drawings:
Electric base 1,
cable 3,
electric base body 10,
guide hole 101,
output end 102,
conductive copper block 103,
through hole 1031,
screw 11,
screw hole 1032,
spacer 12,
electric meter 13,
input cable 31,
output cable 32,
bottom shell 104,
cover 105,
electric gateway 2,
electric gateway body 21, and
wire 14.

DETAILED DESCRIPTION

Figure 2:
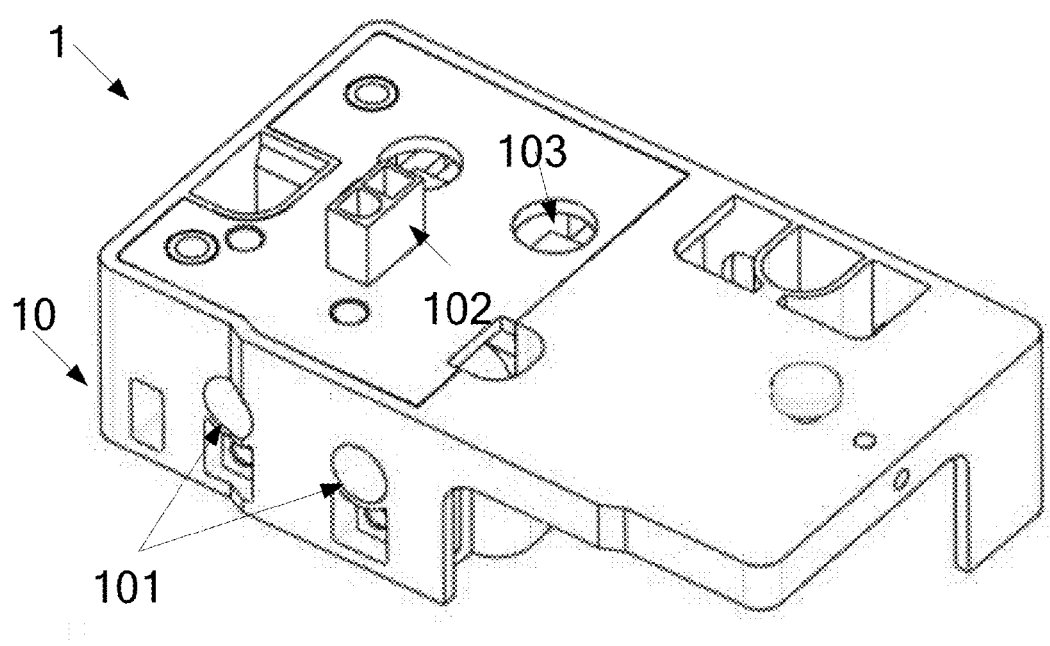
FIG. 2 is a schematic structural diagram of an electric base according to an embodiment of the present invention.
Figure 3:
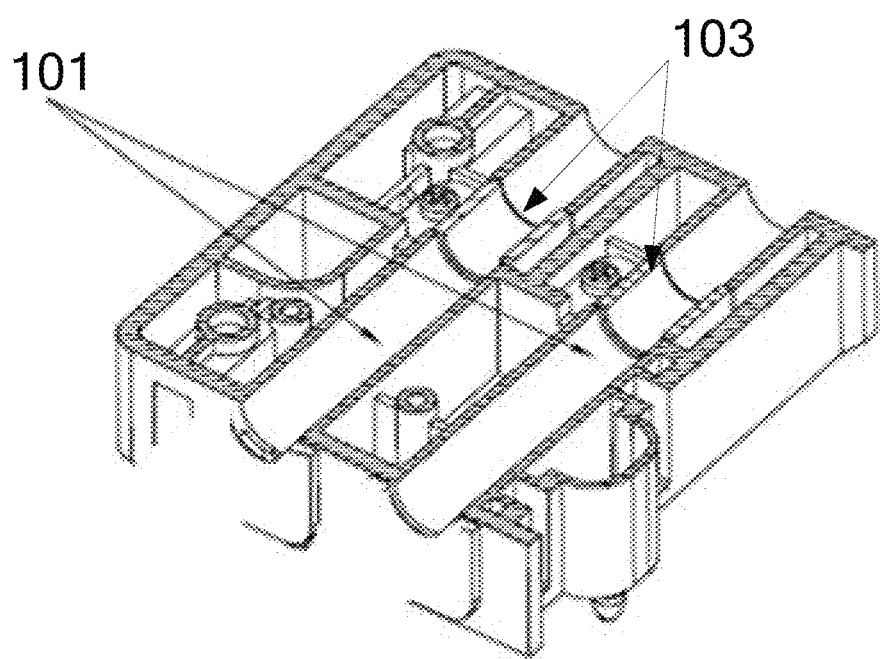
FIG. 3 is a sectional view of the electric base shown in FIG. 2.
Figure 4:
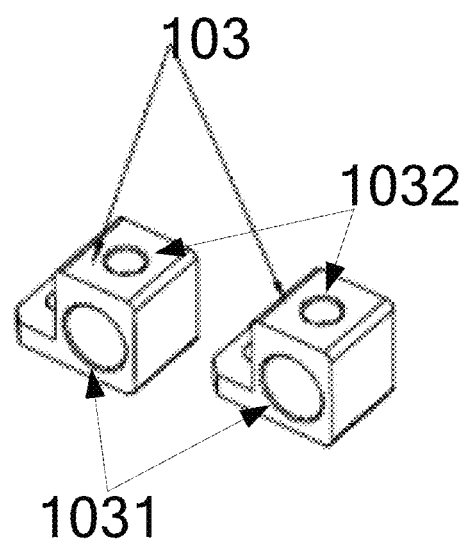
FIG. 4 is a schematic structural diagram of conductive copper blocks of the electric base shown in FIG. 2.
Figure 5A:
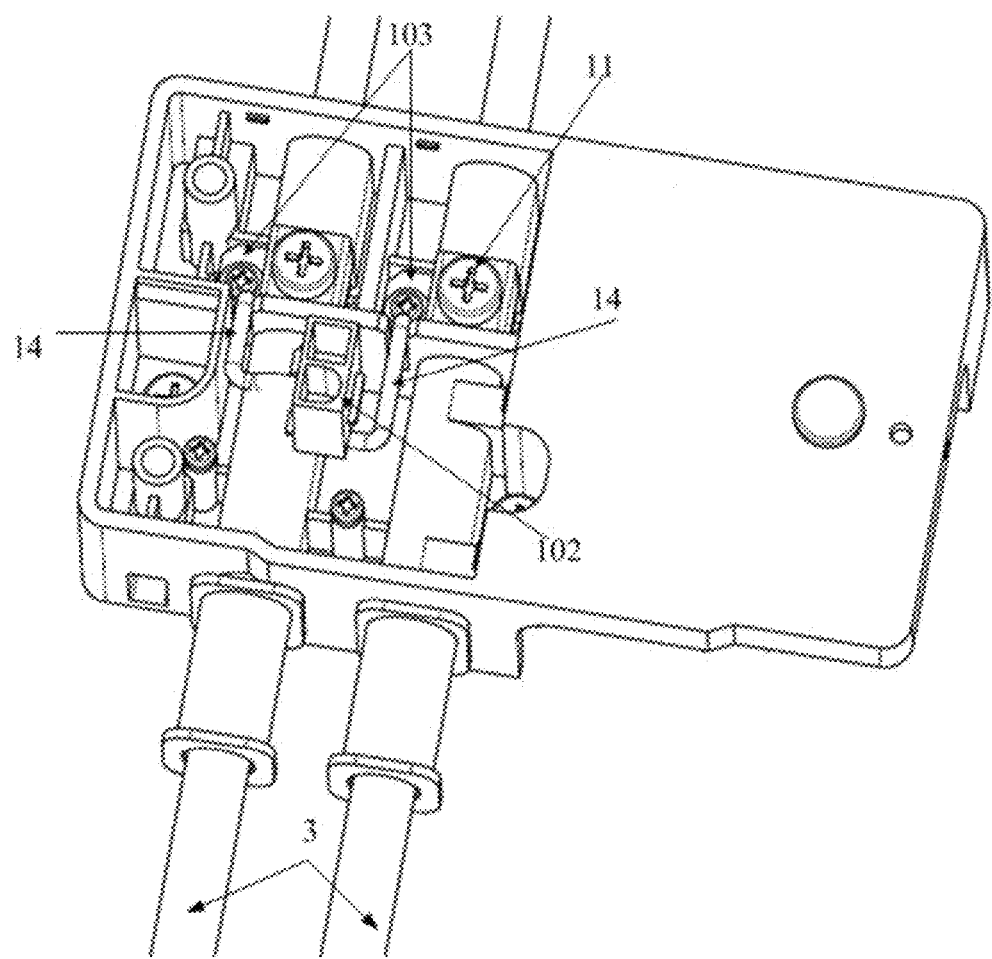
FIG. 5A and FIG. 5B are schematic structural diagrams of an electric base according to another embodiment of the present invention.
Figure 5B:
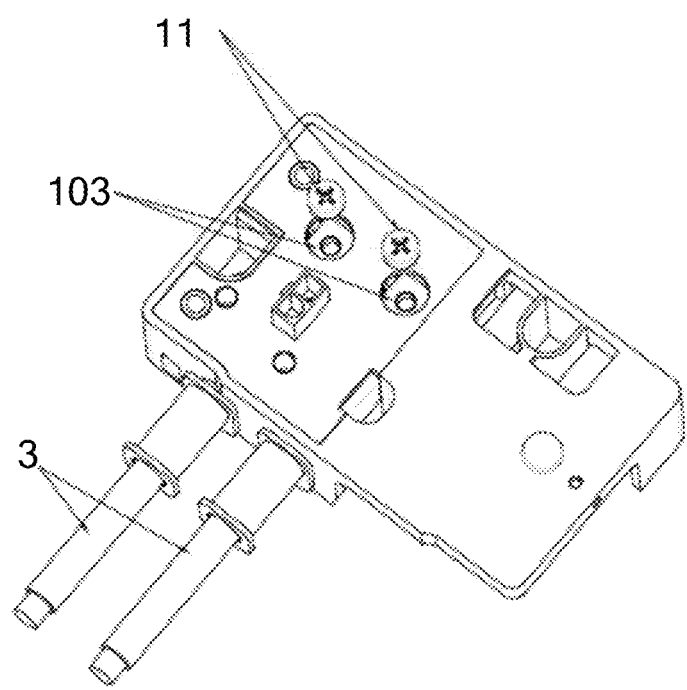

Referring to FIG. 1 to FIG. 3, FIG. 1 is a schematic structural diagram of an electric base according to an embodiment of the present invention, FIG. 2 is a schematic structural diagram of an electric base according to an embodiment of the present invention, and FIG. 3 is a sectional view of a part of the structure of an electric base. In this embodiment, an electric base 1 includes an electric base body 10, where two guide holes 101 for passing cables 3 (as shown in FIG. 5A and FIG. 5B) in an electric grid are arranged on the electric base body 10 in this embodiment, as shown in FIG. 2; an output end 102 for outputting a voltage of the cables is arranged on the electric base body 10 and protrudes from the electric base body 10; and a conductor structure is nested in the electric base body 10 to connect the cables 3 and the output end 102. In particular, the conductor structure may be a conductive copper block 103 shown in FIG. 4, which is not limited to the structure shown in FIG. 4 and a specific conductor structure may be arranged according to the structure of the actual electric base body 10.

Generally, there are two cables in an electric grid, such as a live wire and a neutral wire. Accordingly, as shown in FIG. 3, there may be two guide holes in the electric base in this embodiment, and the two guide holes 101 may be distributed in parallel, with each guide hole 101 corresponding to one cable 3, so that the two cables in the electric grid can pass through the electric base body 10. Definitely, in a particular scenario, if there are three cables in the electric grid, three parallel guide holes need to be arranged in the electric base body 10.

The conductor structure is further used to electrically connect the cable 3 and the output end 102 and each cable 3 corresponds to one conductor structure, so there are also two conductor structures in this embodiment.

In addition, the output end in this embodiment may be a socket structure with two contact holes. One contact hole of the output end 102 connects to the live wire of the cables 3 through the conductor structure, and the other contact hole of the output end 102 connects to the neutral wire of the cables 3 through the conductor structure. The voltage output by the output end with the two contact holes is the same as the voltage of the cables. It should be noted that in this embodiment, the cables may be cables of an electric grid that are prepared for entering a house. Cables of the electric grid may be used for supplying any voltage ranging from 90 volts to 414 volts.

As can be seen from the foregoing embodiment, in the electric base according to this embodiment, a conductor structure is adopted to directly conduct the voltage of a cable that passes through the guide hole in the electric base body, and then a voltage that is the same as the voltage of the cable and enables an electric gateway body to operate is output through the output end of the electric base, thereby effectively saving the cost of a universal connection device that is required to be arranged in an electric gateway in the prior art, meanwhile expanding the application scope of the electric gateway, and allowing flexible deployment of a network including an electric gateway.

In another embodiment, the conductor structure of the electric base 1 may be a conductive copper block 103. As shown in FIG. 4, FIG. 4 is a schematic structural diagram of conductive copper blocks. A through hole 1031 for passing the cable 3 is arranged on one end of the conductive copper block 103 shown in FIG. 4. The through hole 1031 is disposed in the guide hole 101 (as shown in FIG. 3). When the cable 3 passes through the through hole 1031, the conductive copper block 103 is electrically connected to the cable 3 located in the through hole 1031. The other end of the conductive copper block 103 is electrically connected to an output end 102. Alternatively, the other end of the conductive copper blocks 103 is electrically connected to the output end 102 through a wire 14, as shown in FIG. 5A.

Definitely, in an actual application, a fastener for fastening the conductive copper block 103 and the cable 3 needs to be further arranged in the electric base 1, so as to connect the conductive copper block 103 and the cable 3 steadily. For example, the fastener may be a screw 11 shown in FIG. 5B, and at this time, a screw hole 1032 (as shown in FIG. 4) communicating with a through hole 1031 is further arranged on the conductive copper block 103. In this case, the screw 11 passes through the screw hole 1032 to fasten the cable 3 and the conductive copper block 103, as shown in FIG. 5A and FIG. 5B.

Figure 6:
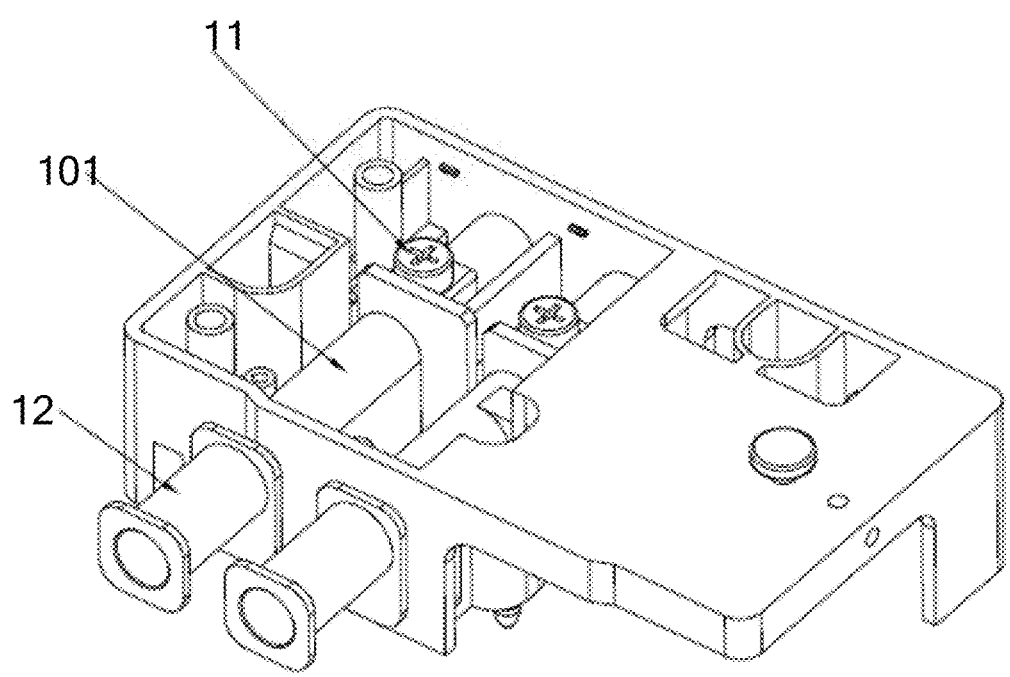
FIG. 6 is a partial schematic structural diagram of the electric base shown in FIG. 5B.

Furthermore, FIG. 6 shows a spacer 12 communicating with the guide hole 101 on the electric base. In another application scenario, the electric base 1 may further include an electric base body 10 and a spacer 12 for separating a cable passing through the electric base body 10 from a neighboring device that shares the cable. In particular, the spacer for passing the cable is communicated with the guide hole.

Figure 7:
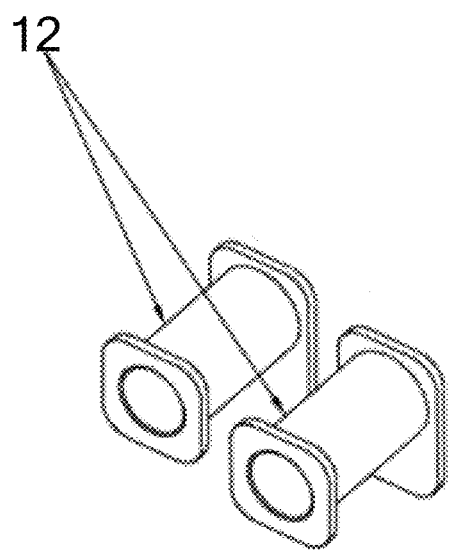
FIG. 7 is a schematic structural diagram of a spacer on the electric base shown in FIG. 5B.

The spacer 12 shown in FIG. 7 is a hollow cylinder structure made of insulation materials. The spacer 12 in the cylinder structure may make an electric base keep in a safe distance from another device using the same cable as the electric base. In this way, safe use of the electric base is ensured. The spacer 12 in this embodiment is further configured to keep two cables used by the electric base in a safe distance, that is, to prevent short circuit caused by the contact of a live wire and a neutral wire in the cables.

Figure 8:
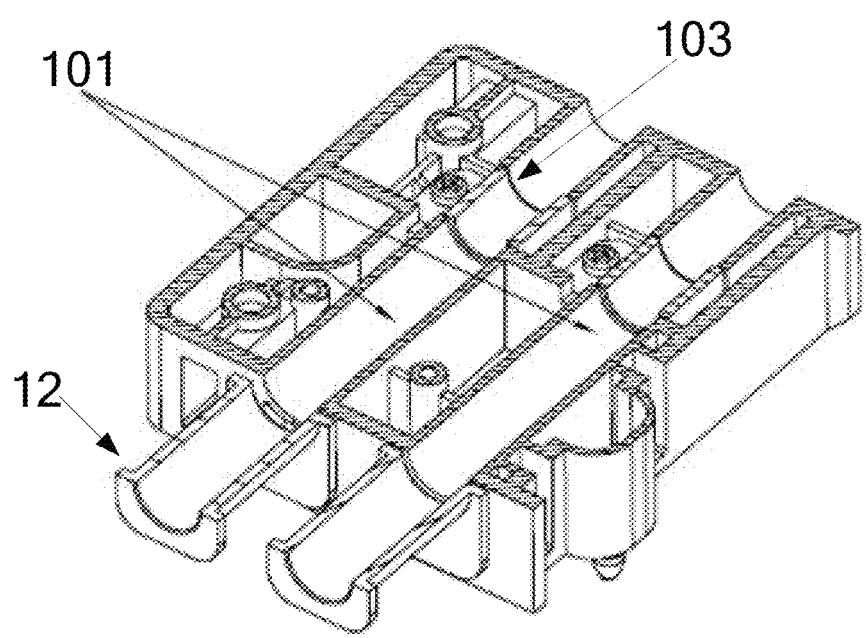
FIG. 8 is a sectional view of the electric base shown in FIG. 6.

In this embodiment, the spacer 12 for passing a cable is communicated with the guide hole 101. It should be understood that, as shown in FIG. 8, the spacer 12 shown in FIG. 7 is communicated with one end of the guide hole 101. In other embodiments, the spacer 12 may be further communicated with the other end of the guide hole 101, or the guide hole 101 may be communicated with the spacers 12 at both ends.

The electric base may be arranged flexibly based on a configuration requirement of an electric gateway body, which extends the application scope of an electric gateway, and therefore allows flexible deployment of a network including the electric gateway.

Figure 9:
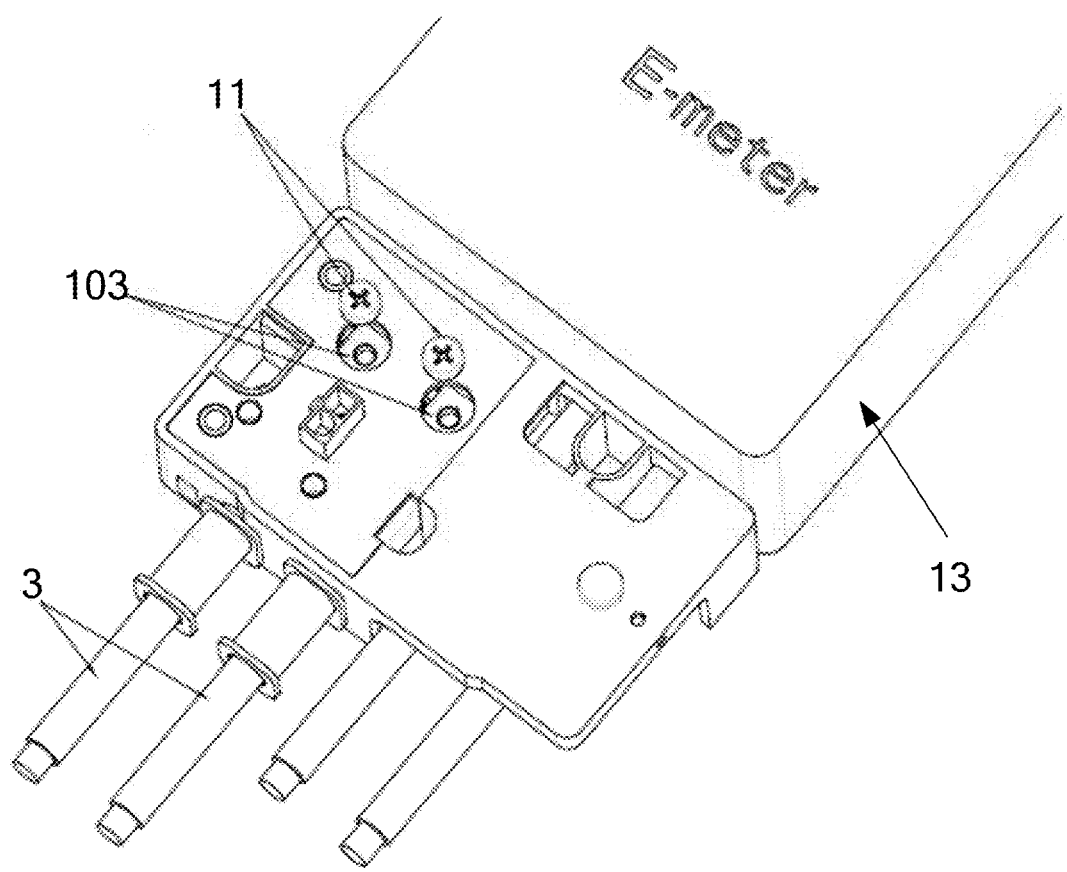
FIG. 9 is a schematic structural diagram of an electric base according to another embodiment of the present invention.
Figure 10:
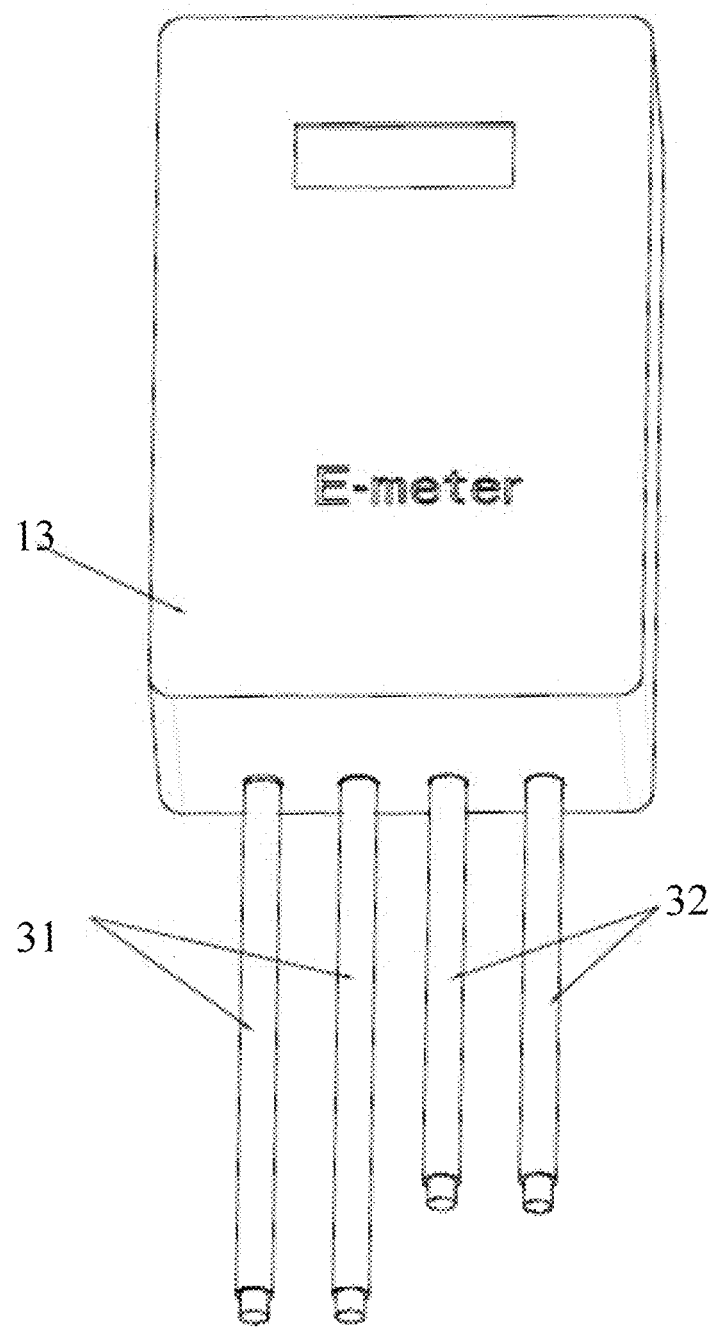
FIG. 10 is a schematic structural diagram of an electric meter on the electric base shown in FIG. 9.

Referring to FIG. 9 and FIG. 10, FIG. 9 is a schematic structural diagram of an electric base according to another embodiment of the present invention, and FIG. 10 is a schematic structural diagram of an electric meter of the electric base. A difference in structure between the electric base in this embodiment and an electric base in other embodiments is that the electric base in this embodiment further includes an electric meter 13, as shown in FIG. 9.

Definitely, the electric meter 13 in this embodiment may be the same as an intelligent meter in the prior art. An input end of the electric meter is connected to an input cable 31 and an output end of the electric meter is connected to an output cable 32, as shown in FIG. 10. In this embodiment, a cable 3 passing through an electric base body 10 on an electric base may be an input cable connected to the input end of the electric meter 13. In the structure of the electric base, the voltage output by the output end 102 on the electric base 1 does not pass through the electric meter 13. In this case, the amount of electricity used by the electric base 1 is not a part of power calculated by the electric meter.

In another embodiment, a cable 3 passing through an electric base body 10 may be an output cable connected to the output end of the electric meter 13. In the structure of the electric base, the voltage output by the output end 102 on the electric base 1 does not pass through the electric meter 13. However, it should be noted that, the amount of electricity used by the electric base 1 is a part of the amount of electricity that the electric meter needs to calculate.

The foregoing electric base body may be arranged on an input cable of an electric meter or may also be arranged on an output cable of an electric meter. Its specific position may be determined according to an actual requirement and is not limited in this embodiment.

In addition, an installation manner of the electric base in this embodiment includes the following steps:

Step 1: Strip a cable to enable a cable core of the cable inserted into a guide hole to electrically contact a conductive copper block, that is, to be electrically connected to the conductive copper block.

Step 2: Pass the cable through a spacer 12 and a guide hole of the electric base body 10 in turn to reach an input end of the electric meter 13, so that the cable core of the cable 3 electrically contacts the conductive copper block 103, and simultaneously the tip of the cable core of the cable 3 is electrically connected to the input end of the electric meter 13.

Step 3: Adopt a screw 11 to fasten the conductive copper block 103 and the cable 3 through a screw hole 1032 of the conductive copper block 103.

Step 4: An output end 102 of the electric base 1 outputs the voltage from a cable in the electric grid.

The foregoing installation manner is simple and easy to implement and the spacer on the electric base achieves a protective effect by reserving a sufficient safe distance between neighboring devices that share the cable. In addition, the operation of electrically connecting the tip of the cable core of the cable to the input end of the electric meter may be omitted if an electric base does not include an electric meter in other embodiments.

Figure 11:
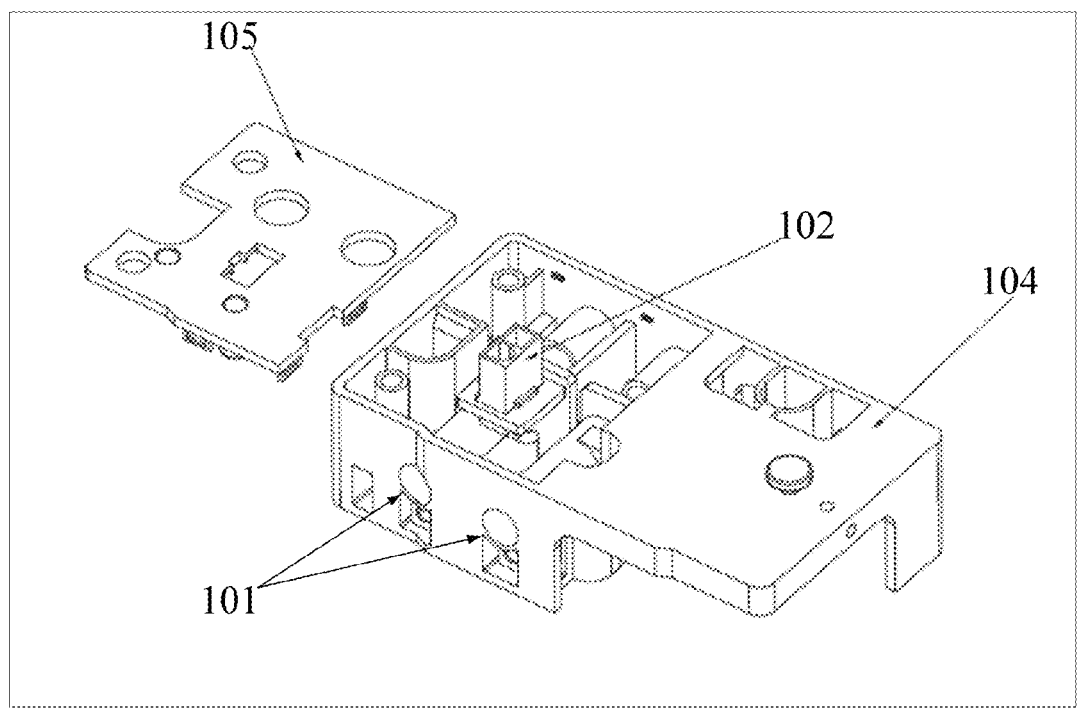
FIG. 11 is a schematic combination diagram of an electric base body according to another embodiment of the present invention.

As shown in FIG. 11, the electric base body 10 in the foregoing embodiment may further include a bottom shell 104 arranged with the guide holes 101 and the conductor structure/conductive copper block, and a cover 105 matching the bottom shell 104, where the foregoing output end 102 is arranged on the bottom shell 104 and protrudes from the cover 105.

The electric base in any one of the foregoing embodiments can extend the application scope of an electric gateway body such as a concentrator/converter.

In another aspect in the present invention, the present invention further provides an electric gateway. The electric gateway includes an electric gateway body and the electric base according to any one of the foregoing embodiments, where the output end of the electric base is electrically connected to an input end of the electric gateway body. For example, if the output end of the electric base is a socket structure with two contact holes, the input end of the electric gateway body may be a plug structure with two plugs. In this way, the plugs of the input end of the electric gateway body can be directly inserted into the socket on the output end of the electric base, so that the output end of the electric base is electrically connected to the input end of the electric gateway body.

Figure 12:
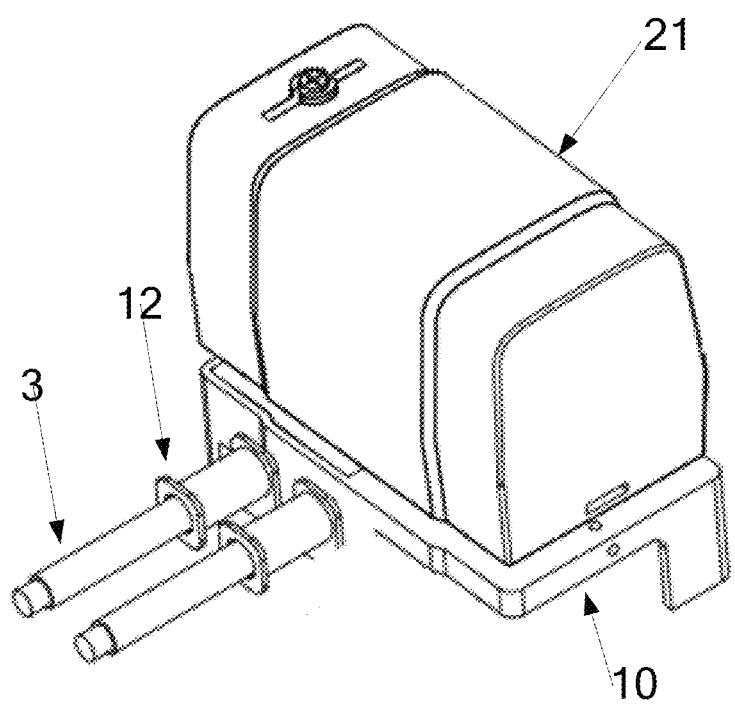
FIG. 12 is a schematic structural diagram of an electric gateway according to another embodiment of the present invention.
Figure 13:
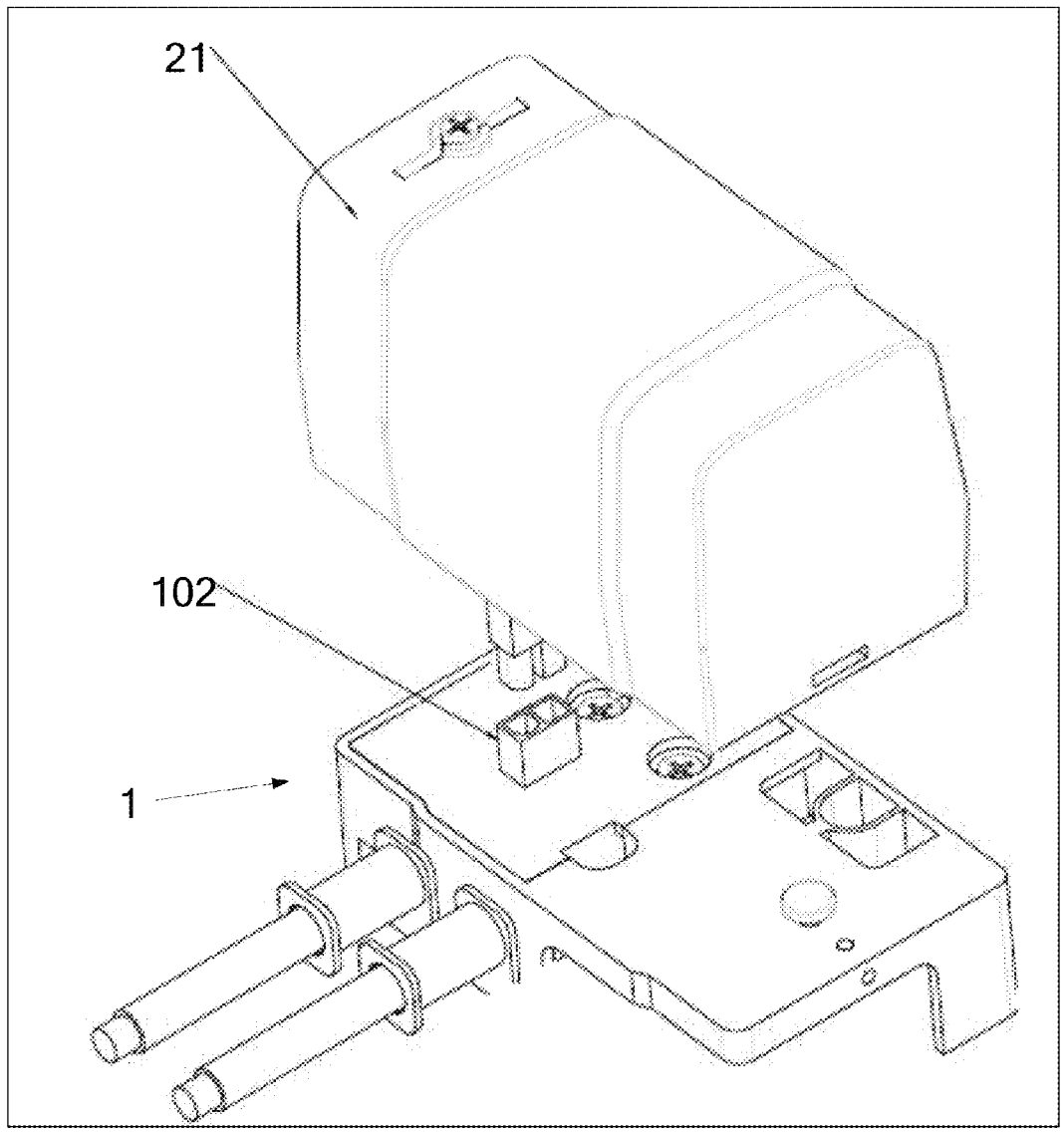
FIG. 13 is a schematic combination diagram of an electric gateway according to another embodiment of the present invention.

Referring to FIG. 12 and FIG. 13, FIG. 12 is a schematic structural diagram of an electric gateway according to another embodiment of the present invention, and FIG. 13 is a combination schematic diagram of an electric gateway according to another embodiment of the present invention. In this embodiment, the electric gateway includes an electric gateway body 21 and an electric base 1, where an output end of the electric base 1 is connected to an input end of the electric gateway body 21. As shown in FIG. 13, the output end of the electric base 1 is a socket structure with contact holes. In this case, the input end of the electric gateway body 21 is a plug structure matching the output end of the electric base, the input end of the electric gateway body 21 matches and is connected to the output end of the electric base 1. In this way, the electric base, where a cable is plugged, supplies power to the electric gateway body 21.

Figure 14:
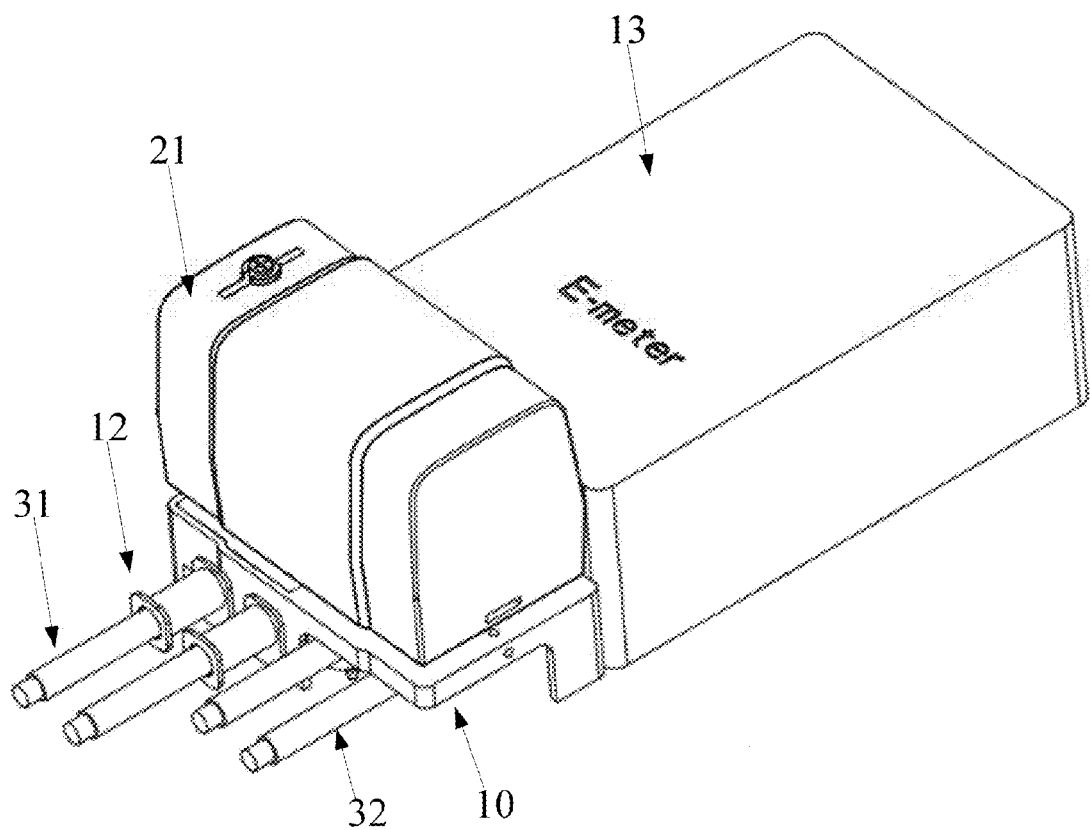
FIG. 14 is a schematic structural diagram of an electric gateway according to another embodiment of the present invention.

In addition, an electric base on an electric gateway shown in FIG. 14 may further include an electric meter 13. For the structure of the electric base, reference may be made to the foregoing embodiments.

In another aspect in the present invention, the present invention further discloses a structure of an electric gateway body. The electric gateway body includes a concentrator box and an input end for supplying a power voltage to the concentrator box, where the input end is a plug structure for matching an output end of an electric base. In this embodiment, the output end of the electric base may be a socket structure with a contact hole. If there are two contact holes, there may also be two plugs on the input end. The electric gateway body having the foregoing input end has a wider application scope.

Finally, it should be noted that the foregoing embodiments are merely intended for describing the technical solutions of the present invention, rather than limiting the present invention. Although the present invention is described in detail with reference to the foregoing embodiments, a person of ordinary skill in the art should understand that he may still make modifications to the technical solutions described in the foregoing embodiments, or make equivalent replacements to some or all the technical features thereof, without departing from the scope of the technical solutions of the embodiments of the present invention.

What is claimed is:

1. An electric base, comprising:
    an electric base body, wherein at least one guide hole for passing cable in an electric grid is arranged in the electric base body;
    an output end for outputting a voltage of the cable arranged on the electric base body, wherein the output end protrudes from the electric base body; and
    a conductor structure nested in the electric base body to electrically connect the cable to the output end and a second output connection,
    wherein the output end is connected to an electric gateway body, and
    wherein the second output connection is connected to an electric meter.

2. The electric base according to claim wherein the conductor structure is a conductive copper block, wherein a through hole for passing the cable is arranged on a first end of the conductive copper block, wherein the through hole is disposed in the guide hole, wherein the conductive copper block is electrically connected to the cable located in the through hole when the cable passes the through hole, and wherein a second end of the conductive copper block is electrically connected to the output end, or the second end of the conductive copper block is electrically connected to the output end through a wire.

3. The electric base according to claim 2, further comprising a fastener for fastening the conductive copper block and the cable.

4. The electric base according to claim 3, wherein the fastener is a screw, wherein the conductive copper block is arranged with a screw hole communicated with the through hole, and wherein the screw passes through the screw hole to fasten the cable and the conductive copper block.

5. The electric base according to claim 1, further comprising a spacer for separating the cable passing through the electric base body from a neighboring device sharing the cable.

6. The electric base according to claim 5, wherein the spacer for passing the cable is communicated with the guide hole.

7. The electric base according to claim 1, wherein the electric base body comprises:
    a bottom Shell arranged with the guide holes and the conductor structure; and
    a cover matching the bottom shell,
    wherein the output end is arranged on the bottom shell and protrudes from the cover, and wherein the cover is flush with the electric gateway body.

8. The electric base according to claim 1, wherein the second output connection is connected to either an input end of the electric meter or an output end of the electric meter.

9. The electric base according to claim 1, wherein the output end is a socket structure with two contact holes.

10. An electric gateway, comprising:
    an electric base comprising:
        an electric base body;
        at least one guide hole for passing cable in an electric grid are arranged in the electric base body;
        an output end for outputting a voltage of the cable arranged on the electric base body, wherein the output end protrudes from the electric base body; and
        a conductor structure nested in the electric base body to electrically connect the cable to the output end and a second output connection;
    an electric gateway body coupled to the electric base, wherein the output end of the electric base is electrically connected to an input end of the electric gateway body; and
    an electric meter, wherein the second output connection is electrically connected to an input end of the electric meter.

11. The electric gateway according to claim 10, wherein the conductor structure is a conductive copper block, Wherein a through hole for passing the cable is arranged on a first end of the conductive copper block, wherein the through hole is disposed in the guide hole, wherein the conductive copper block is electrically connected to the cable located in the through hole when the cable passes through the through hole, and wherein a second end of the conductive copper block is electrically connected to the output end, or the second end of the conductive copper block is electrically connected to the output end through a wire.

12. The electric gateway according to claim 11, further comprising a fastener for fastening the conductive copper block and the cable.

13. The electric gateway according to claim 12, wherein the fastener is a screw, wherein the conductive copper block is arranged with a screw hole communicated with the through hole, and wherein the screw passes through the screw hole to fasten the cable and the conductive copper block.

14. The electric gateway according to claim 10, further comprising a spacer for separating the cable passing through the electric base body from a neighboring device sharing the cable.

15. The electric gateway according to claim 14, wherein the spacer for passing the cable is communicated with the guide hole.

16. The electric gateway according to claim 10, wherein the electric base body comprises:
    a bottom shell arranged with the guide holes and the conductor structure; and
    a cover matching the bottom shell, wherein the output end is arranged on the bottom shell and protrudes from the cover, and wherein the cover is flush with the electric gateway body.

17. The electric gateway according to claim 10, wherein the output end is a socket structure with two contact holes.

18. The electric gateway according to claim 10, wherein the electric gateway body is removably coupled to the electric base.

* * * * *

UNITED STATES PATENT AND TRADEMARK OFFICE
CERTIFICATE OF CORRECTION

PATENT NO.       : 9,588,138 B2
APPLICATION NO.  : 14/313066
DATED            : March 7, 2017
INVENTOR(S)      : Yezong Wei et al.

Page 1 of 1

It is certified that error appears in the above-identified patent and that said Letters Patent is hereby corrected as shown below:

On the Title Page

Item (30), Foreign Application Priority Data should read:
Mar. 31, 2012   (CN) .................. 201220146182.X In the Claims Column 7, Line 31, Claim 2 should read:
The electric base according to claim 1, wherein the conductor structure is a conductive copper block, wherein a through hole for passing the cable is arranged on a first end of the conductive copper block, wherein the through hole is disposed in the guide hole, wherein the conductive copper block is electrically connected to the cable located in the through hole when the cable passes the through hole, and wherein a second end of the conductive copper block is electrically connected to the output end, or the second end of the conductive copper block is electrically connected to the output end through a wire.

Signed and Sealed this
Twenty-fourth Day of April, 2018

Andrei Iancu
*Director of the United States Patent and Trademark Office*